US006768338B1

(12) United States Patent
Young et al.

(10) Patent No.: US 6,768,338 B1
(45) Date of Patent: Jul. 27, 2004

(54) PLD LOOKUP TABLE INCLUDING TRANSISTORS OF MORE THAN ONE OXIDE THICKNESS

(75) Inventors: Steven P. Young, Boulder, CO (US); Venu M. Kondapalli, Sunnyvale, CA (US); Martin L. Voogel, Los Altos, CA (US)

(73) Assignee: Xilinx, Inc., San jose, CA (US)

( * ) Notice: Subject to any disclaimer, the term of this patent is extended or adjusted under 35 U.S.C. 154(b) by 9 days.

(21) Appl. No.: 10/354,587

(22) Filed: Jan. 30, 2003

(51) Int. Cl.[7] .................................................. G06F 7/38
(52) U.S. Cl. ........................ 326/44; 326/39; 326/113; 327/407; 327/408
(58) Field of Search ........................... 326/37–39, 44, 326/48–49, 113; 327/407–408

(56) References Cited

U.S. PATENT DOCUMENTS

| | | | | |
|---|---|---|---|---|
| 5,744,995 A | * | 4/1998 | Young | 327/407 |
| 5,801,551 A | * | 9/1998 | Lin | 326/113 |
| 5,808,483 A | * | 9/1998 | Sako | 326/113 |
| 5,955,912 A | * | 9/1999 | Ko | 327/410 |
| 6,049,227 A | * | 4/2000 | Goetting et al. | 326/80 |
| 6,373,291 B1 | * | 4/2002 | Hamada et al. | 326/113 |
| 6,380,765 B1 | * | 4/2002 | Forbes et al. | 326/112 |
| 6,392,467 B1 | * | 5/2002 | Oowaki et al. | 327/427 |
| 6,448,809 B2 | * | 9/2002 | Goetting et al. | 326/44 |
| 6,667,635 B1 | * | 12/2003 | Pi et al. | 326/40 |

OTHER PUBLICATIONS

U.S. patent application Ser. No. 10/354,520, filed Jan. 30, 2003, Young et al.
Xilinx, Inc.; "Virtex–II Pro Platform FPGA Handbook"; published Oct. 14, 2002; available from Xilinx, Inc., 2100 Logic Drive, San Jose, California 95124; pp. 19–71.

* cited by examiner

Primary Examiner—Michael Tokar
Assistant Examiner—Khai M. Nguyen
(74) Attorney, Agent, or Firm—Lois D. Cartier

(57) ABSTRACT

A structure that can be used, for example, to implement a lookup table for a programmable logic device (PLD). The structure includes configuration memory cells, pass transistors, and a buffer. The pass transistors pass the output of a selected configuration memory cell to the buffer, and are controlled by data input signals of the structure. The pass transistors have a first oxide thickness and are controlled by a value having a first operating voltage. The memory cells and buffer include transistors having a second oxide thickness thinner than the first oxide thickness, and operate at a second operating voltage lower than the first operating voltage. The data input signals are provided at the first operating voltage. Some embodiments include data generating circuits that include transistors having the first oxide thickness. Gate lengths can also vary between the memory cell transistors, pass transistors, buffer transistors, and data generating circuits.

43 Claims, 9 Drawing Sheets

PLD LOOKUP TABLE INCLUDING TRANSISTORS OF MORE THAN ONE OXIDE THICKNESS

FIELD OF THE INVENTION

The invention relates to programmable logic devices (PLDs). More particularly, the invention relates to a lookup table for a PLD that includes transistors having more than one oxide thickness.

BACKGROUND OF THE INVENTION

Programmable logic devices (PLDs) are a well-known type of digital integrated circuit that can be programmed to perform specified logic functions. One type of PLD, the field programmable gate array (FPGA), typically includes an array of configurable logic blocks (CLBS) and programmable input/output blocks (IOBs). The CLBs and IOBs are interconnected by a programmable interconnect structure.

More advanced FPGAs can include more than one type of logic block in the array. For example, the Xilinx Virtex-II Pro™ FPGA includes blocks of Random Access Memory (RAM), blocks implementing multiplier functions, and embedded processor blocks. (The Xilinx Virtex-II Pro FPGA is described in detail in pages 19–71 of the "Virtex-II Pro Platform FPGA Handbook", published Oct. 14, 2002 and available from Xilinx, Inc., 2100 Logic Drive, San Jose, Calif. 95124, which pages are incorporated herein by reference.)

The CLBs, IOBs, interconnect, and other logic blocks are typically programmed by loading a stream of configuration data (bitstream) into internal configuration memory cells that define how the logic blocks and interconnect are configured. The configuration data can be read from memory (e.g., an external PROM) or written into the FPGA by an external device. The collective states of the individual memory cells then determine the function of the FPGA.

FPGA CLBS typically include several "lookup tables" (LUTs). A LUT is an addressable memory array that is typically loaded with data during the configuration process. For example, a Virtex-II Pro CLB includes eight LUTS. Each LUT has four data input terminals that address the configurable memory. By storing predetermined values in the appropriate memory locations, the LUT can be configured to provide any function of up to four variables.

FIG. 1 shows a typical LUT structure 100, which includes 16 memory locations (configuration memory cells M0–M15) addressed by four input signals IN0–IN3. (In the present specification, the same reference characters are used to refer to terminals, signal lines, and their corresponding signals.) The output of each memory cell passes through two pass transistors, one of transistors T0–T15 followed by one of transistors U0–U7. Transistors T0–T15 are controlled by LUT input signal IN0 and its inverse (provided by inverter I0), while transistors U0–U7 are controlled by LUT input signal IN1 and its inverse (provided by inverter I1). After passing through these two transistors, the signals from the memory cells have been narrowed down to four signals on internal nodes INT8–INT11.

Each internal node INT8–INT11 drives a corresponding buffer 101a–101d. The output signals from buffers 101a–101d are again passed through two transistors, one of transistors V0–V3 followed by one of transistors W0–W1. Transistors V0–V3 are controlled by LUT input signal IN2 and its inverse (provided by inverter I2), while transistors W0–W1 are controlled by LUT input signal IN3 and its inverse (provided by inverter I3). The one remaining signal (on internal node INT14) is passed through another buffer 102 to provide the LUT output signal OUT. Thus, by controlling the four pass transistors on each path between the memory cells and the LUT, and by configuring the memory cells to store the desired values, any function of up to four variables can be implemented.

FIG. 1A shows a simplified configuration memory cell Mx that can be used to implement memory cells M0–M15 of FIG. 1. Configuration memory cell Mx can include, for example, a pair of cross-coupled inverters A, B, with two pass transistors d1, d2 that allow the configuration logic (not shown) to access the memory cell. Configuration memory cells are well known in the art of FPGA design, therefore, detailed exemplary descriptions are not included herein.

FIG. 1B illustrates one well-known implementation 101x of buffer 101. Buffer 101x includes two inverters coupled in series. The first inverter includes P-channel transistor P1 (the pullup) and N-channel transistor N1 (the pulldown), coupled in series between power high VDD and ground GND. Optional second inverter I4 can increase the performance of the buffer and ensures that the buffer output signal has the same sense as the buffer input signal. P-channel transistor P2 is driven by the node N between the two inverters, and acts to pull node INT up to VDD such that pullup P1 is fully turned off. Optional P-channel transistor P3 is used to initialize node INT to a high value, for example during reset or power-up of the FPGA. Buffer 102 can be the same as buffer 101x, can omit the initialization pullup, or can be a simple inverter or some other well-known buffer circuit.

The structure shown in FIG. 1 works well at sufficiently high values of VDD (power high, or the operating voltage of the FPGA). For example, for many years VDD was standardized at 5 volts (5 V), plus or minus ten percent (10%). (The ten percent allowable variation was included in the specifications of each device to allow for normal deviations in manufacturing and operation.) However, operating voltages are being steadily reduced both to save power and to meet the requirements of smaller and smaller transistors. For example, a transistor with a thinner oxide layer breaks down at a lower gate voltage than a transistor with a thicker oxide layer. Thus, values of VDD have been reduced to 2.5 V, then 1.8 V, and even as low as 1.5 V. A VDD value of 1.2 V is now contemplated, and at these low voltage levels the structure of FIG. 1 is no longer adequate, as is now described in conjunction with FIG. 2.

When a high value is passed through an N-channel transistor, the voltage is reduced by Vt, the threshold voltage level of the N-channel transistor. (For purposes of simplifying the present discussion, other well-known transistor effects such as the body effect are not described.) For example, FIG. 2 shows an input signal IN passing through transistor T (which is driven by VDD) to internal node INT. Internal node INT drives buffer 201, which provides the output signal OUT. When input signal IN is at the same voltage level as VDD, the voltage at internal node INT is the gate voltage reduced by one threshold voltage (VINT= VDD−Vt).

This well-known limitation presents no problem when VDD=5 V, as described above. When processes supporting this operating voltage are used, the N-channel threshold voltage is less than one volt (1 V). Thus, the voltage at internal node INT is still more than four volts (4 V), which is quite sufficient to turn on the N-channel pulldown N1, thus turning on P-channel pullup P2 in buffer 201 (see FIG.

1B). However, at sufficiently low levels of VDD, the voltage at internal node INT is so low as to impair the performance of the circuit.

For example, if node INT does not rise sufficiently high, the N-channel pulldown in buffer 201 might not be completely on, and the P-channel pullup P2 might not be sufficiently on to quickly turn off pullup P1. Thus, the pullup (e.g., pullup P1) "fights" the pulldown (e.g., pulldown N1), and slows down the switching of the output node. For example, referring again to FIG. 1B, while P-channel transistor P2 helps in raising node INT to VDD once node N goes low, transistor P2 is no help if node N does not go low enough to turn it on.

As described, there is a voltage drop when a high voltage is passed across an N-channel transistor. However, there is no corresponding voltage drop of a high voltage across a P-channel transistor. Therefore, one solution to this problem is to replace the N-channel transistor with paired N- and P-channel transistors, with the P-channel transistors being driven by the complementary input signal. However, this solution can double the size of the lookup table by doubling the number of pass transistors. Further, both the true and complement signals must be provided to the paired transistors, which increases the die area. Larger buffers must also be provided to handle the increased load of driving both the N- and P-channel transistors.

Another way to accommodate lower VDD levels is to drive the gates of the N-channel transistors with a voltage level VGG higher than VDD, as shown in FIG. 3 and Table 1. In this case, the voltage level after passing a high value VDD through the N-channel transistor T is the gate voltage VGG minus the N-channel threshold voltage Vt, or VINT=VGG−Vt. Voltage level VGG is often specified for an FPGA, where VGG is the maximum voltage that can safely be applied to the gate of a transistor in the device. The VGG voltage level is at least partially determined by the oxide thickness of the transistor. Generally speaking, the thicker the layer of oxide over the transistor, the higher the voltage level that can be applied to the gate without damaging the transistor. Additionally, the longer the gate length (channel length) of the transistor, the less leakage current (i.e., off state current) occurs across the transistor from source to drain. Therefore, up to an intrinsic limit, the longer the gate length, the higher the voltage level that can be applied across the source and drain of the transistor without producing an unacceptably high leakage current.

However, FPGA manufacturers are not only reducing operating voltage levels on their devices, but are also reducing minimum feature sizes to lower costs. Sometimes, each new product generation uses a lower operating voltage and has reduced feature sizes. Reduced feature sizes mean thinner oxide and shorter gate lengths. Therefore, specified values of VGG are being rapidly reduced. For example, Table 1 shows the relationships between various exemplary values of VDD (the operating voltage), VGG (the maximum allowable gate voltage), Vt (the N-channel threshold voltage), and VINT (the voltage at node INT). Also included are typical gate lengths for each manufacturing process. All of the values shown in Table 1 are merely exemplary, as they vary between processes and manufacturers. VDD values are specified as nominal operating voltages.

TABLE 1

| VDD | VGG | Vt | VINT = VGG-Vt | Gate Length |
|---|---|---|---|---|
| 5.0 V | 7+ V | 0.7 V | >5 V | 0.5+ micron |
| 2.5 V | 2.7 V | 0.6 V | 2.1 V | 0.25 micron |
| 1.5 V | 1.6 V | 0.55 V | 1.05 V | 0.12 micron |
| 1.2 V | 1.3 V | 0.5 V | 0.8 V | 0.08 micron |

Note that as VGG approaches twice the threshold voltage (VGG=2Vt), the voltage at node INT becomes insufficient to adequately turn on pulldown N1 (see FIG. 1B). Therefore, it is desirable to provide alternative structures for implementing lookup tables in FPGAs that can accommodate a lower operating voltage and smaller feature sizes than known structures. It is further desirable to provide circuits having the same characteristics that can be used for any purpose in FPGAs or other integrated circuits.

SUMMARY OF THE INVENTION

The invention provides a structure that can be used, for example, to implement a lookup table (LUT) for a programmable logic device (PLD). The structure includes transistors of varying oxide thickness, operating voltage, and, in some embodiments, gate length.

The structure includes a plurality of configuration memory cells, a first plurality of pass transistors, and a buffer. The pass transistors pass the output of a selected configuration memory cell to the buffer, which provides a buffer output signal. In some embodiments, the buffer output signal is the output signal for the structure. Some embodiments include more than one such buffer, and the buffer output signals are passed through at least a second plurality of pass transistors to an output buffer, which provides the output signal for the structure.

The pass transistors are controlled by the data input signals of the structure. The pass transistors have a first oxide thickness and the data input signals are provided at a first operating voltage. The memory cells and buffer(s) include transistors having a second oxide thickness thinner than the first oxide thickness, and,operate at a second operating voltage lower than the first operating voltage. In some embodiments, the second operating voltage is the operating voltage used as a supply voltage by a majority of the transistors in the PLD.

Some embodiments include data generating circuits (e.g., inverters, level shifters, input multiplexers, and so forth) that provide the signals controlling the pass transistors. Because these circuits provide signals at the first operating voltage, they include transistors having the first oxide thickness.

In some embodiments, the gate length also varies between the memory cell transistors, pass transistors, buffer transistors, and data generating circuit transistors. To support the higher operating voltage with acceptable leakage, the data generating circuits have the longest gate length. The memory cell transistors and buffer transistors, on the other hand, operate at the lower voltage (with thinner oxide) and can have the shortest gate length without generating unacceptable leakage current. The pass transistors are gated by the higher voltage and thus require the thicker oxide. However, the drain-to-source voltage for the pass transistors is less than the higher operating voltage, so the gate length of the pass transistors can be somewhere between the longest and shortest gate lengths without generating unacceptable leakage current.

In other embodiments, the data generating circuits and pass transistors have a first and longer gate length, while the memory cell transistors and buffer transistors have a second and shorter gate length. In yet other embodiments, the gate lengths are the same for the data generating circuits, pass transistors, memory cell transistors, and buffer transistors.

According to some embodiments, a circuit includes a plurality of memory cells, an internal node, a plurality of pass transistors coupled between the plurality of memory cells and the internal node, and a buffer coupled between the internal node and an output terminal. Each pass transistor has a gate terminal coupled to receive from a data input terminal a selected one of a ground signal and a power high signal at a first voltage level. Each pass transistor has a first oxide thickness. Each memory cell is coupled to an operating voltage at a second voltage level less than the first voltage level. Each memory cell includes memory cell transistors having a second oxide thickness, where the second oxide thickness is less than the first oxide thickness. The buffer is coupled to an operating voltage at the second voltage level. The buffer includes buffer transistors having the second oxide thickness.

In some embodiments, the circuit is a lookup table (LUT) structure in an FPGA. In other embodiments, the circuit forms a portion of a PLD other than an FPGA, such as a Complex Programmable Logic Device, (CPLD), or a fuse or antifuse device, for example. In other embodiments, the circuit forms a portion of a non-programmable IC.

According to some embodiments, an FPGA includes an interconnect structure, a plurality of input multiplexers coupled to the interconnect structure and to an operating voltage at a first voltage level, and a plurality of LUT structures coupled to the input multiplexers. Each of the LUT structures includes a plurality of memory cells, an internal node, an output terminal coupled to the interconnect structure, a plurality of data input terminals each coupled to an output terminal of one of the input multiplexers, a plurality of pass transistors coupled between the memory cells and the internal node, and a buffer coupled between the internal node and the output terminal.

Each pass transistor has a gate terminal coupled to receive from a data input terminal a selected one of a ground signal and a power high signal at the first voltage level. Each pass transistor has a first oxide thickness. Each memory cell is coupled to an operating voltage at a second voltage level less than the first voltage level, and includes memory cell transistors having a second oxide thickness, where the second oxide thickness is less than the first oxide thickness. The buffer is coupled to an operating voltage at the second voltage level, and includes buffer transistors having the second oxide thickness. Each input multiplexer includes input multiplexer transistors having the first oxide thickness.

In some embodiments, each LUT structure includes additional pass transistors and buffers, and the buffer is coupled to the output terminal through the additional pass transistors and buffers.

In some embodiments, the FPGA includes input/output blocks coupled to the interconnect structure. Each input/output block includes input/output transistors having a third oxide thickness greater than the first oxide thickness. Thus, the FPGA includes transistors having three different oxide thicknesses.

According to some embodiments, an integrated circuit device (IC) includes a plurality of input/output blocks, a plurality of interconnect lines coupled to the input/output blocks; and a circuit coupled to the interconnect lines. The circuit includes a plurality of memory cells, an internal node, an output terminal coupled to one of the interconnect lines, a data generating circuit coupled to the interconnect lines and to an operating voltage at a first voltage level, a plurality of pass transistors coupled between the memory cells and the internal node, and a buffer coupled between the internal node and the output terminal.

Each pass transistor has a gate terminal coupled to receive from the data generating circuit a selected one of a ground signal and a power high signal at a first voltage level. The data generating circuit includes data generating transistors having a first oxide thickness. Each pass transistor has the first oxide thickness. Each memory cell is coupled to an operating voltage at a second voltage level less than the first voltage level. Each memory cell includes memory cell transistors having a second oxide thickness, where the second oxide thickness is less than the first oxide thickness. The buffer is coupled to an operating voltage at the second voltage level. The buffer includes buffer transistors having the second oxide thickness.

In some embodiments, the input/output blocks each comprise input/output transistors having a third oxide thickness greater than the first oxide thickness.

According to some embodiments, a circuit includes a plurality of first input terminals, an internal node, a plurality of pass transistors coupled between the first input terminals and the internal node, and a buffer coupled between the internal node and an output terminal. Each pass transistor has a gate terminal coupled to receive from a data input terminal a selected one of a ground signal and a power high signal at a first voltage level. Each pass transistor has a first oxide thickness. Each first input terminal is coupled to provide a selected one of the ground signal and a power high signal at a second voltage level less than the first voltage level. The buffer is coupled to an operating voltage at the second voltage level. The buffer includes buffer transistors having a second oxide thickness, where the second oxide thickness is less than the first oxide thickness.

BRIEF DESCRIPTION OF THE DRAWINGS

The present invention is illustrated by way of example, and not by way of limitation, in the following figures.

DETAILED DESCRIPTION OF THE DRAWINGS

The present invention is believed to be applicable to a variety of integrated circuits, including but not limited to programmable logic devices (PLDs). The present invention has been found to be particularly applicable and beneficial when applied to field programmable gate arrays (FPGAs), and in particular to lookup tables (LUTS) in FPGAs. While the present invention is not so limited, an appreciation of the present invention is presented by way of specific examples, which in this instance are directed to such FPGA LUTs.

In the following description, numerous specific details are set forth to provide a more thorough understanding of the present invention. However, it will be apparent to one skilled in the art that the present invention can be practiced without these specific details.

Figure 4:
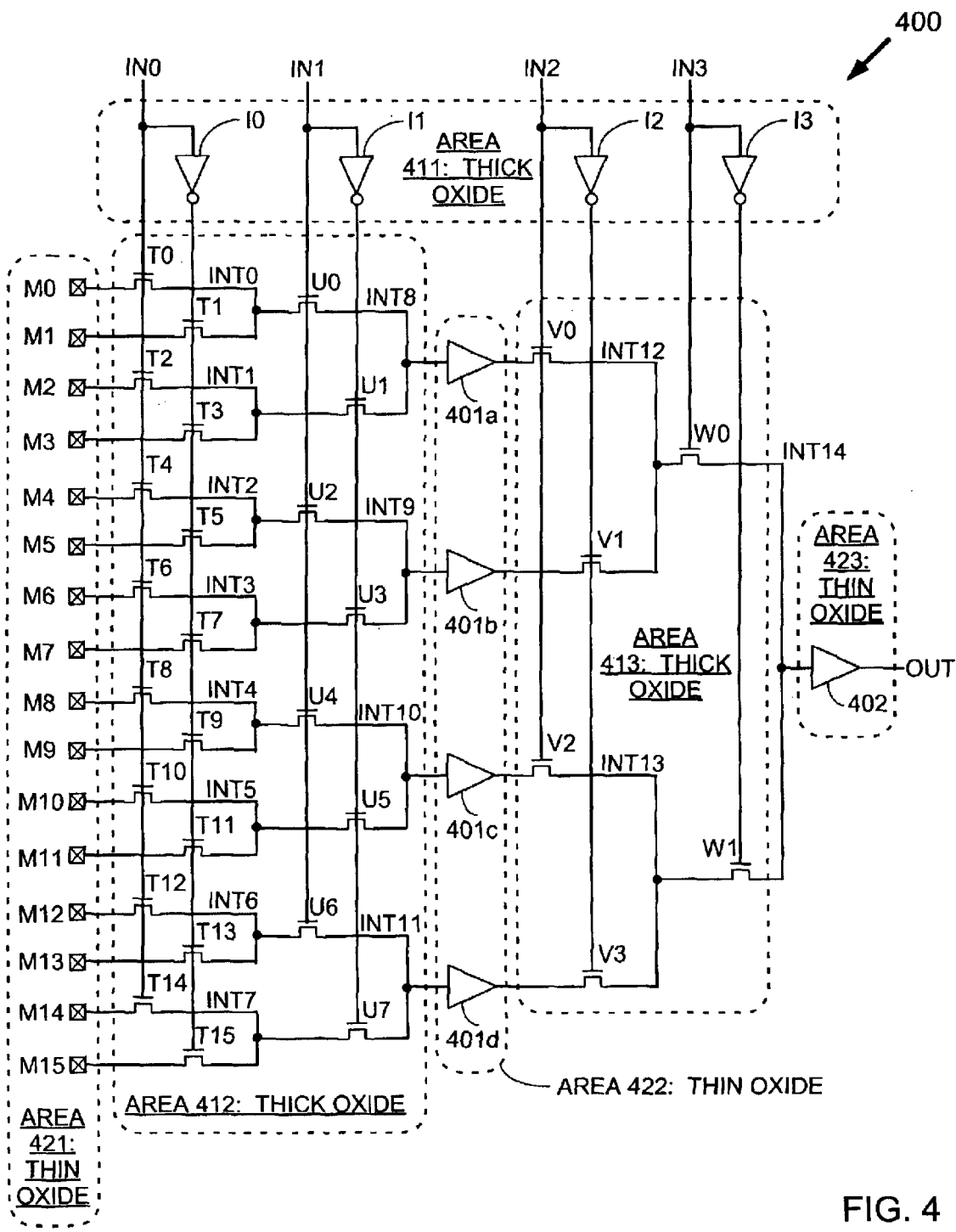
FIG. 4 shows a first LUT structure for an FPGA that includes transistors having two different oxide thicknesses according to an embodiment of the invention.

FIG. 4 illustrates a circuit 400 according to one embodiment of the invention. The circuit can be used, for example, to implement an FPGA LUT. Circuit 400 includes memory cells M0–M15, pass transistors T0–T15, U0–U7, V0–V3, and W0–W1, buffers 401a–401d and 402, and inverters I0–I3.

Pass transistors T0–T15, U0–U7, V0–V3, and W0–W1 have gate terminals coupled to receive output signals from input terminals IN0–IN3 and their inverted values, which are provided by inverters I0–I3. Pass transistors T0–T15 and U0–U7 are coupled between memory cells M0–M15 and internal nodes INT8–INT11, which respectively drive buffers 401a–401d. Thus, pass transistors T0–T15 and U0–U7 act to reduce the 16 possible memory cell values to four under control of the signals on input terminals IN0–IN3. In some embodiments, where the circuit is an FPGA LUT, input terminals IN0–IN3 are the data input terminals of the LUT, and the data on input terminals IN0–IN3 is provided by four input multiplexers driven by signals from the interconnect structure of the FPGA.

The output signals from buffers 401a–401d are each passed through two more pass transistors (two of pass transistors V0–V3 and W0–W1) to internal node INT14. Internal node INT14 drives buffer 402, which provides the circuit output signal OUT. When circuit 400 is used to implement an FPGA LUT, at any given time only one of the paths between the memory cells and the output terminal OUT is fully enabled (i.e., has all of the pass transistors enabled along the path).

It is common for FPGA LUTs to have four data input terminals (e.g., IN0–IN3). However, other numbers of input terminals can also be used. Further, any number of pass transistors can be used, subject to standard design considerations such as layout area and capacitance. Yet further, one or more levels of pass transistors can be used. For example, in some embodiments, there is only one "bank" of pass transistors between the memory cells and the output terminal, i.e., the buffers in area 422 of FIG. 4 are omitted. Such design considerations are well known in the IC design art.

Figure 1:
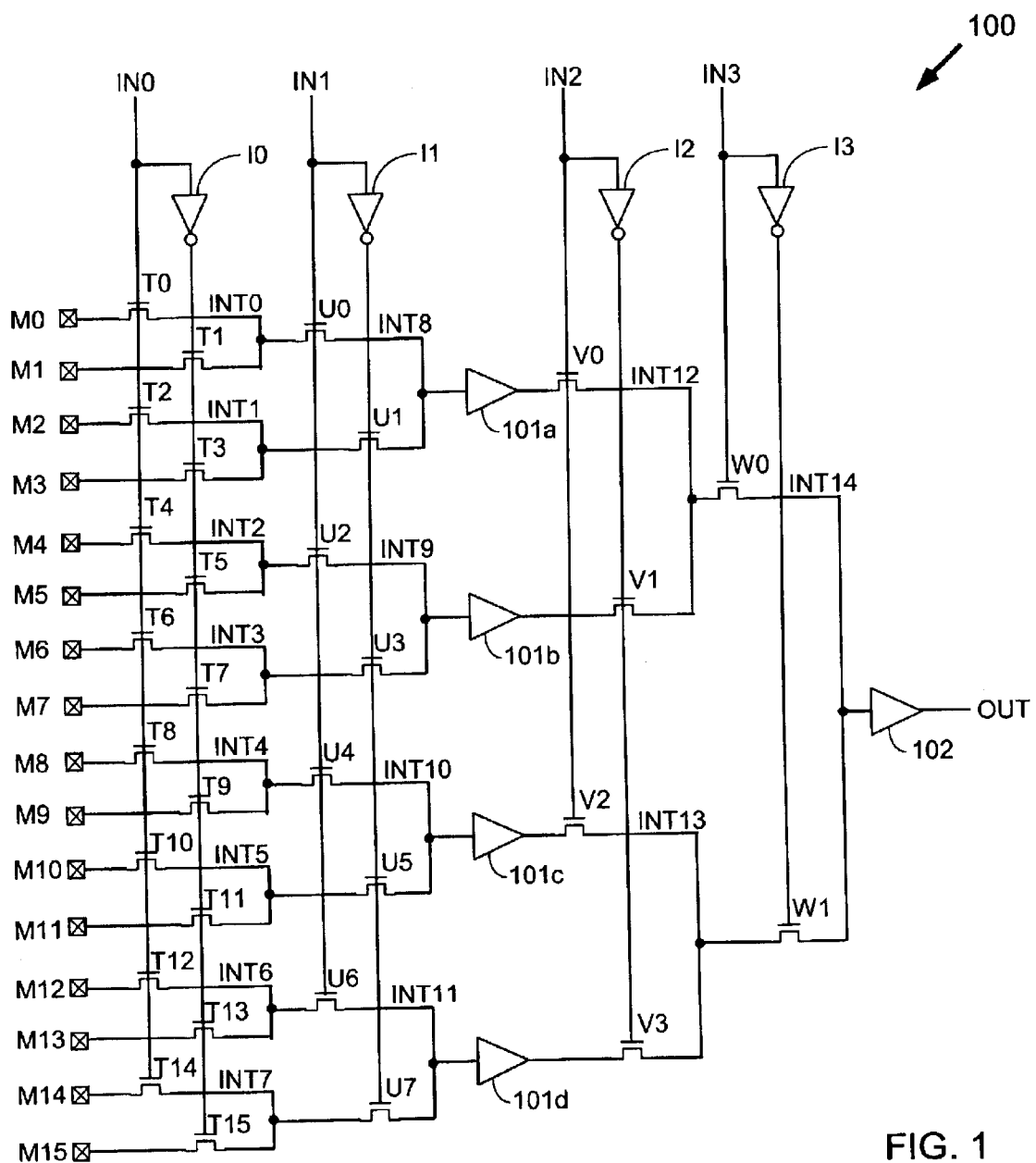
FIG. 1 shows a known programmable lookup table (LUT) structure for an FPGA.

As described in the preceding paragraphs, the circuit shown in FIG. 4 is similar to the circuit 100 shown in FIG. 1. However, circuit 400 is divided into several different areas manufactured using different oxide thicknesses and operated at different operating voltages, as is now described. Note that the areas designated in FIGS. 4–10 do not necessarily correspond to actual physical areas of the device including the circuit, but are conceptual divisions included in the figures to simplify the process of understanding the invention.

Many different implementations can be used to implement buffers 401a–401d and 402. For example, buffer 101x of FIG. 1B can be used to implement buffers 401a–401d and 402. Alternatively, a simple inverter can be used, or another known buffer design. In any case, buffers 401a–401d (in area 422) and buffer 402 (in area 423) use an operating voltage of VDD. The transistors in the buffer are manufactured using a thin oxide layer.

In some embodiments, buffers 401a–401d and 402 are implemented using a doped N-channel pulldown (e.g., transistor N1 in FIG. 1B) that has a lower threshold voltage than standard N-channel transistors. This lower threshold voltage improves the speed at which nodes INT8–INT11 and INT14 are pulled to VDD and reduces the delay of passing a high value though the buffers (at the cost of a higher leakage current).

In some embodiments, the operating voltage VDD of the buffers is the same as the operating voltage used for the majority of transistors in the FPGA.

Many different implementations can be used to implement memory cells M0–M15. For example, memory cell Mx of FIG. 1A can be used. However, many other memory cell implementations can be used. Each memory cell provides to a data terminal of an associated pass transistor either the ground value (zero volts) or a voltage level VDD. Therefore, the operating voltage of the memory cells is VDD, and the memory cell transistors can be manufactured using the thin oxide layer (see area 421 in FIG. 4).

Figure 1A:
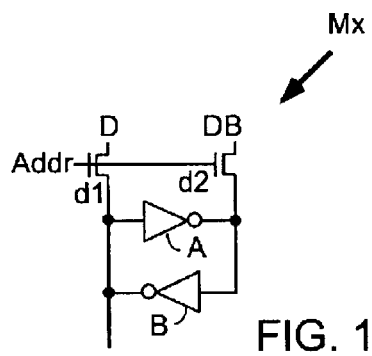
FIG. 1A shows a known configuration memory cell for an FPGA.

Some embodiments include the configuration memory cell from the Xilinx Virtex-II Pro FPGA. In a PLD, memory cells can include (in addition to a pair of cross-coupled gates and read/write transistors as shown in FIG. 1A) other well-known logic such as configuration logic, initialization logic, and/or readback logic (not shown).

As in some prior art circuits, the gate terminals of the pass transistors are driven either by a ground value or by a voltage level VGG higher than the operating voltage VDD of the buffers and memory cells. However, in the circuits of the invention, the pass transistors (areas 412–413) are manufactured using a thicker oxide layer than the buffer and memory cell transistors (areas 421–423). The thicker oxide makes it possible to apply a higher voltage level VGG to the gates than was possible using previously known methods, which in turn raises the voltage at internal nodes INT0–INT14 and causes the circuit to operate more quickly across varying process conditions than would otherwise be possible.

Because inverters I0–I3 provide signals at a high value of VGG, the inverters have an operating voltage of VGG and are manufactured using the thick oxide voltage (area 411). Similarly, the circuits providing input signals IN0–IN3 should also have an operating voltage of VGG and use the thicker oxide.

Figure 5:
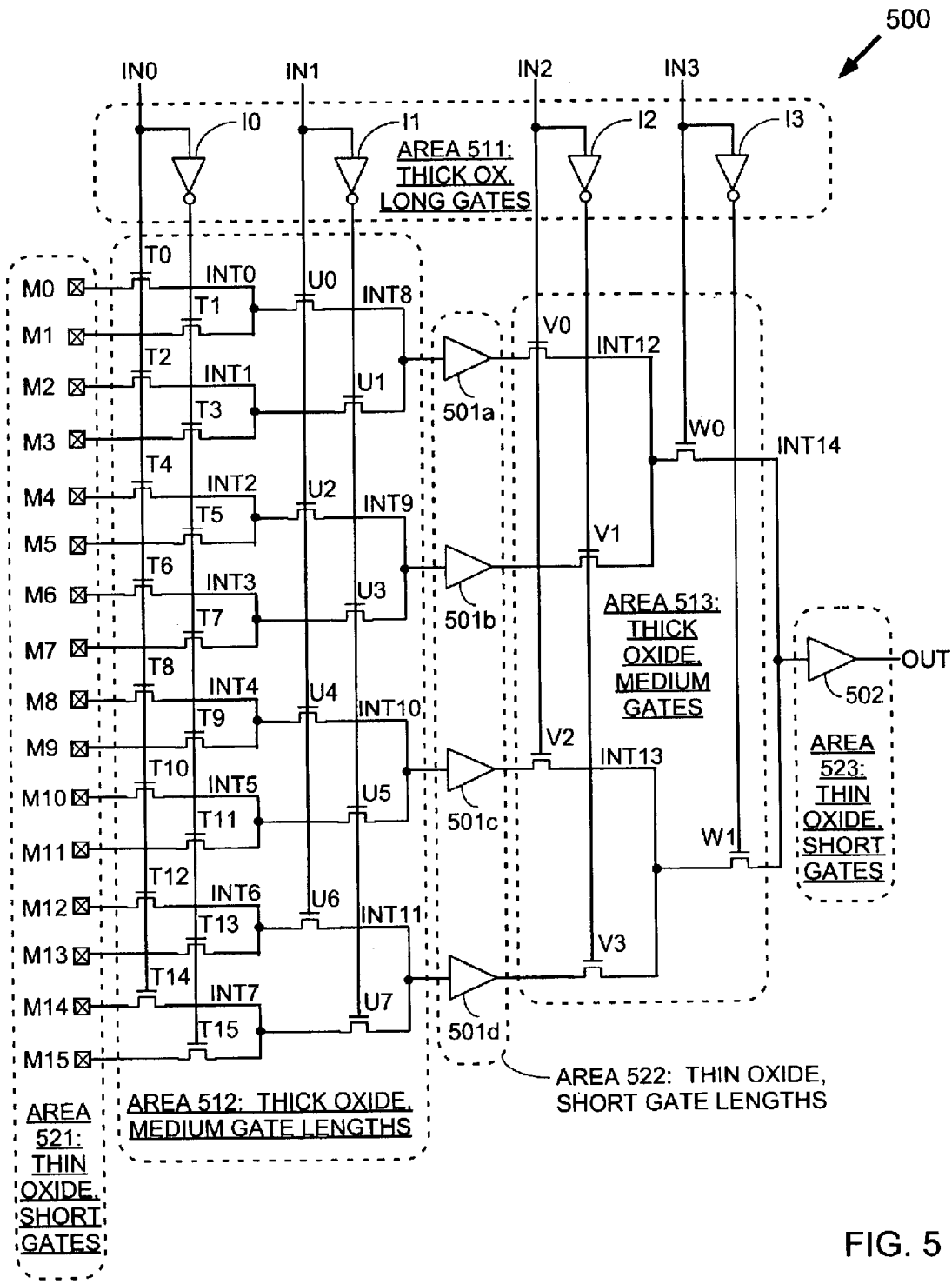
FIG. 5 shows a first LUT structure for an FPGA that includes transistors having two different oxide thicknesses and three different gate lengths according to an embodiment of the invention.

Considering area 411 of FIG. 4 to constitute a data generating circuit, the data generating circuit can include inverters (as shown in FIGS. 4 and 5) and/or other circuits.

Figure 6:
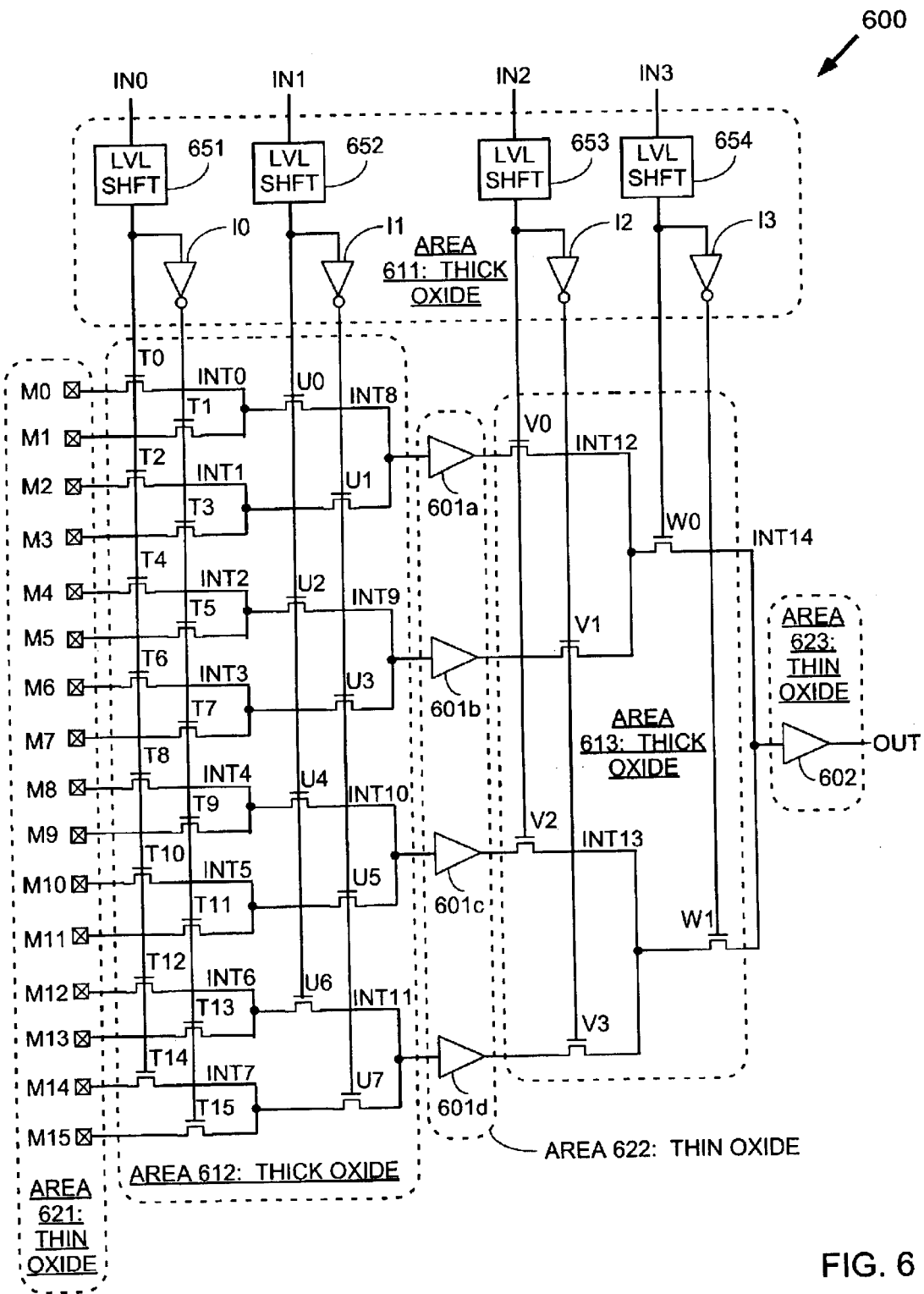
FIG. 6 shows a second LUT structure for an FPGA that includes transistors having two different oxide thicknesses according to an embodiment of the invention.
Figure 7:
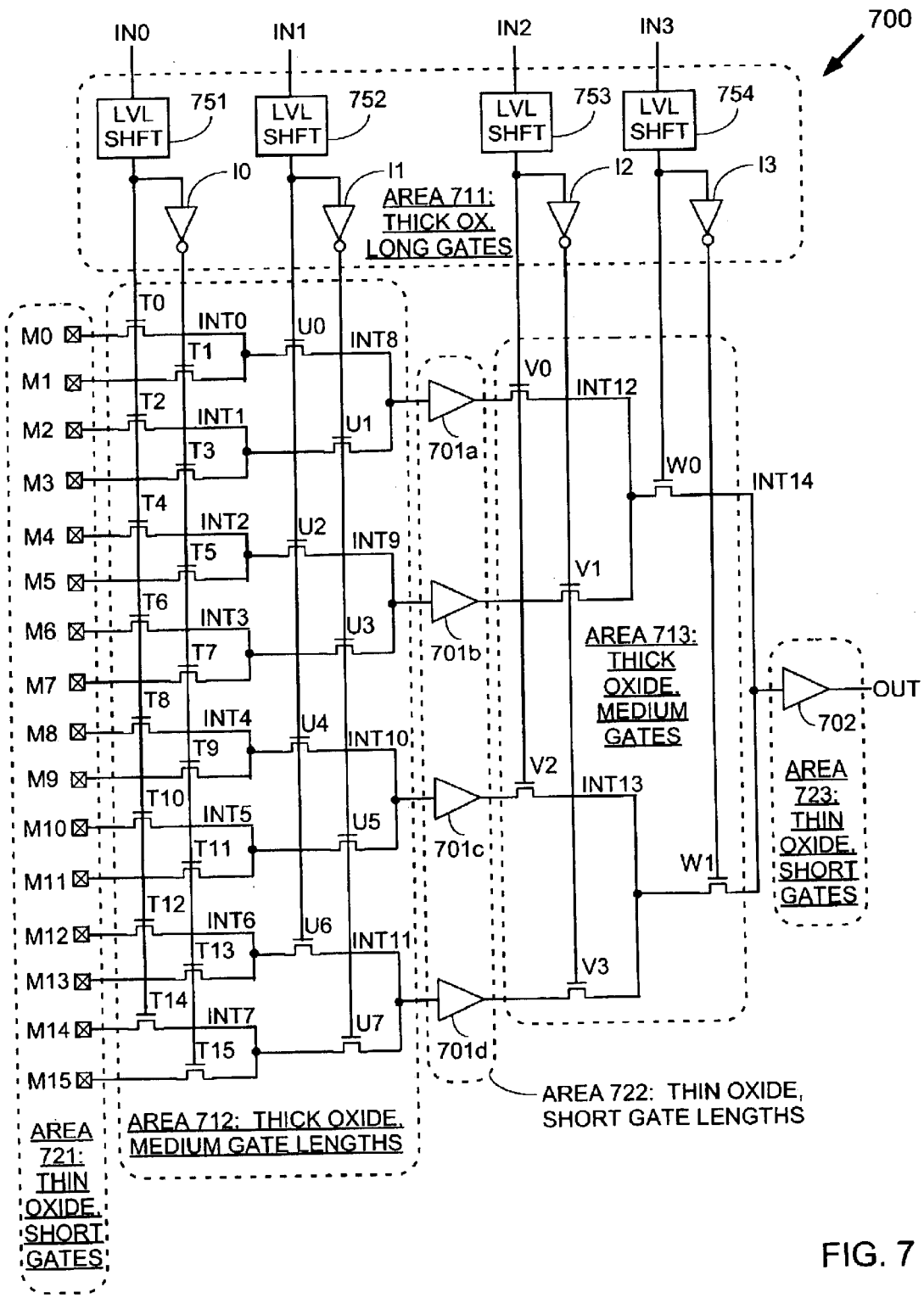
FIG. 7 shows a second LUT structure for an FPGA that includes transistors having two different oxide thicknesses and three different gate lengths according to an embodiment of the invention.

For example, as shown in FIGS. 6 and 7 and described below, level shifters can be used to drive the pass transistors, where the level shifters accept an input signal at the VDD level and provide an output signal at the VGG high level. Such level shifters are well known in the art of circuit design. As another example, shown in FIGS. 8–10 and described below, the data generating circuit can include input multiplexers similar to those commonly used in FPGAS, but where the input multiplexers use an operating voltage of VGG and include transistors manufactured using thick oxide. Other circuits can also be used, provided that the signals provided to drive the pass transistors are at the VGG high level.

Figure 3:
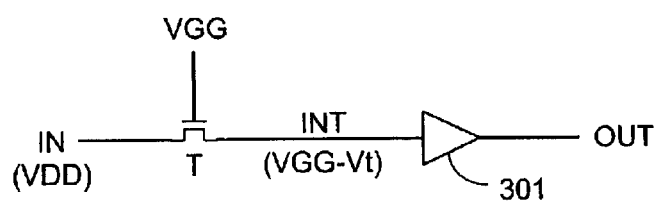
FIG. 3 shows a pass gate followed by a buffer, where two different operating voltages are used by the illustrated circuit.

As explained above in connection with FIG. 3, when a voltage value of VDD is applied to input terminal IN and a voltage value of VGG is applied to the gate of pass transistor T, the voltage at internal node INT rises to the level of VGG minus Vt (VGG−Vt) or VDD, whichever is lower, where Vt is the threshold voltage of the pass transistor. Table 2 shows the resulting voltage values for the circuit for one exemplary embodiment.

TABLE 2

| Thin Oxide | | Thick Oxide | | VINT |
|---|---|---|---|---|
| VDD | Vt(thin) | VGG | Vt(thick) | (=VGG-Vt(thick)) |
| 1.2 V | 0.5 V | 1.5 V | 0.55 V | 0.95 V |

Comparing Table 2 to the last line of Table 1, it can be seen that by using thicker oxide for the pass transistor and raising the gate voltage to 1.5 V, the voltage at internal node INT has increased from 0.8 V to 0.95 V, thereby enhancing the performance of the circuit.

FIG. 5 shows another circuit 500 according to another embodiment of the invention. The circuit can be used, for example, to implement an FPGA LUT. Circuit 500 is similar to circuit 400 of FIG. 4, but includes differing gate lengths in the different areas of the circuit. Only the points of difference from circuit 400 are described.

For a given source/drain voltage and oxide thickness, an IC manufacturer typically specifies a minimum gate length. The specified minimum gate is generally longer for gates with a thicker oxide. Thus, when a higher operating voltage is used, in addition to using a thicker oxide it is generally necessary to increase the gate length of any minimum-sized transistors involved. Further, when a higher voltage (e.g., VGG instead of VDD) is applied across a transistor, leakage current increases. This leakage current can be reduced by making the transistors longer, i.e., increasing the gate length. Note that in area 511 of FIG. 5, each transistor can have a maximum drain-source voltage of VGG. However, in areas 521–523, which have an operating voltage of VDD, the maximum drain-source voltage is VDD. Thus, in some embodiments the transistors in area 511 have a longer gate length than the transistors of areas 521–523.

However, note also that the maximum drain-source voltage across pass transistors T0–T15, U0–U7, V0–V3, and W0–W1 is not VGG, but VDD. Therefore, the gate length of the pass transistors in areas 512–513 need not necessarily be as long as those of the transistors in area 511 to have an acceptable leakage current. In some embodiments, because of the lower drain-source voltage, the gate length of pass transistor G can be lower than the minimum gate length generally specified for other transistors having the same oxide thickness and manufactured using the same process.

Thus, in some embodiments the memory cell and buffer transistors (areas 521–523) have the shortest gate length, the data generating circuit transistors (area 511) have the longest gate length, and the pass transistors (areas 512–513) have a gate length somewhere between the two.

Table 3 shows the operating voltage, oxide thickness, maximum source/drain voltage, and gate length used in one embodiment for each area of FIG. 5. The term "operating voltage" as applied to pass transistors as used in Table 3 denotes the high voltage supplied to the gate terminal of the pass transistor. The oxide thicknesses are measured in nanometers (nm).

TABLE 3

| Area | Operating Voltage | Oxide Thickness | Source/Drain Voltage | Gate Length |
|---|---|---|---|---|
| 511 | 1.5 V | 2.2 nm | 1.5 V | 0.12 microns |
| 512–513 | 1.5 V | 2.2 nm | 1.2 V | 0.09 microns |
| 521–523 | 1.2 V | 1.3 nm | 1.2 V | 0.08 microns |

In some embodiments, the gate lengths of the N-channel transistors and the P-channel transistors are not the same. For example, in some embodiments leakage current is higher for N-channel devices. Therefore, in these embodiments it can be desirable to use a somewhat longer gate length for the N-channel transistors than for corresponding P-channel transistors, to reduce leakage.

FIG. 6 illustrates an embodiment similar to the embodiment of FIG. 4, but in which the data generating circuit (area 611) includes level shifters and inverters. A level shifter 651–654 is inserted between each data input terminal IN0–IN3 and the associated pass transistors. As described above in relation to FIG. 4, the level shifters accept an input signal at the VDD level and provide an output signal at the VGG high level. Thus, data input terminals IN0–IN3 can accept input signals at the VDD high level. Level shifters are well known in the art of circuit design. At least the output transistors of the level shifter are preferably manufactured using the thicker oxide used in the other transistors of area 611.

FIG. 7 illustrates an embodiment similar to that of FIG. 5, but in which the data generating circuit (area 711) includes level shifters and inverters manufactured using the thicker oxide and longer gate lengths than those used in the other areas of the circuit. A level shifter 751–754 is inserted between each data input terminal IN0–IN3 and the associated pass transistors. As in the embodiment of FIG. 5, three different gate lengths are used. The longest gate lengths are used in the level shifters and inverters of area 711, the shortest gate lengths are used in the memory cells and buffers of areas 721–723, and a gate length between the two is used for the pass transistors of areas 712–713.

Figure 8:
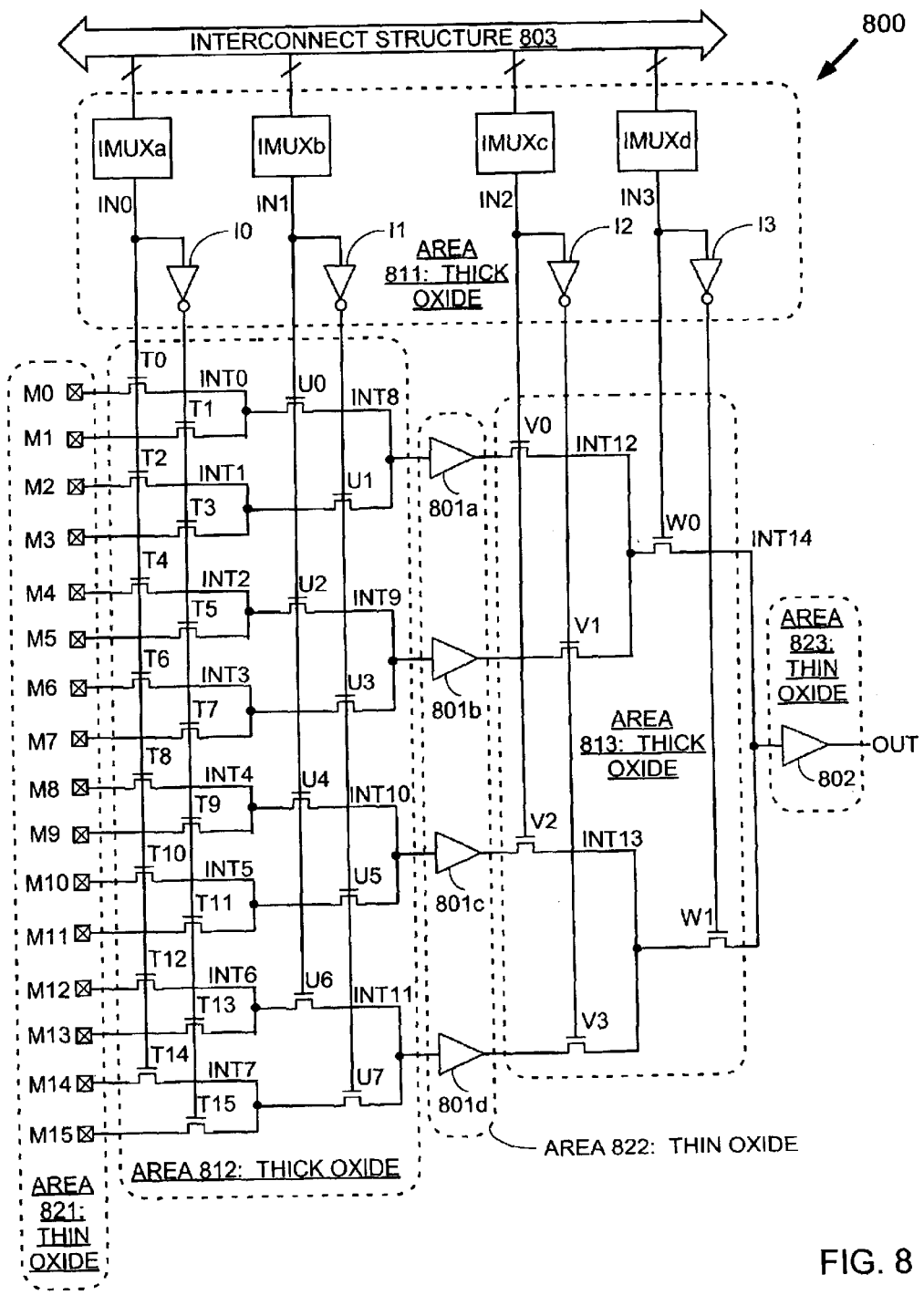
FIG. 8 shows a portion of a first FPGA according to an embodiment of the invention.

FIG. 8 illustrates a portion of an FPGA in which the LUTs are implemented according to one aspect of the present invention. The data generating circuit (area 811) includes input multiplexers and inverters. Input multiplexers IMUXa–IMUXd are inserted between the interconnect structure of the FPGA and the data input terminals IN0–IN3. The input multiplexers can be, for example, similar to the input multiplexers of the Xilinx Virtex-II Pro FPGA, but manufactured using the thicker oxide used for the transistors in area 811. The input multiplexers use an operating voltage of VGG, in order to drive the pass transistors at the VGG high level.

Figure 9:
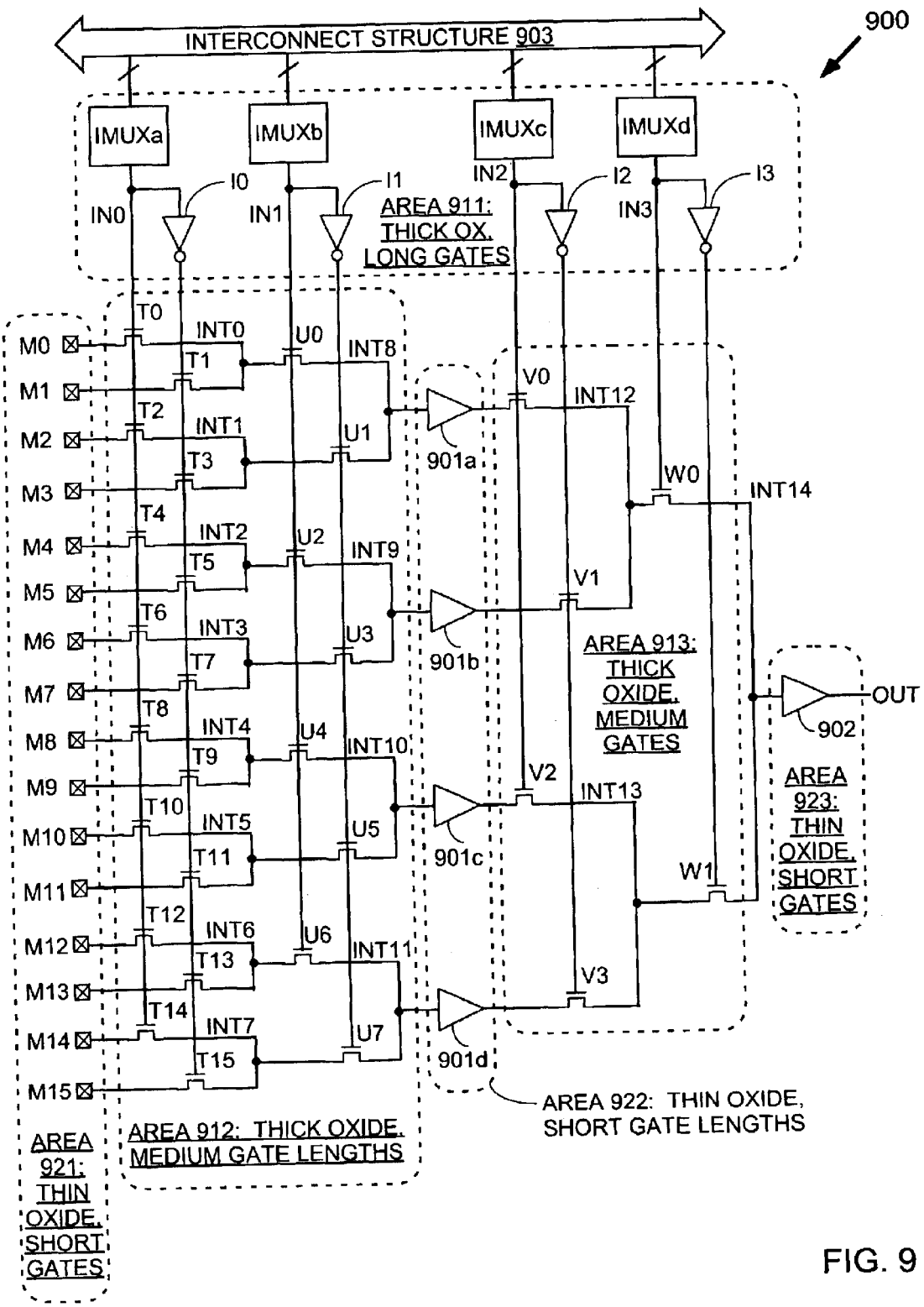
FIG. 9 shows a portion of a second FPGA according to an embodiment of the invention.

FIG. 9 illustrates a portion of an FPGA in which the LUTs are implemented according to another aspect of the present invention. The data generating circuit (area 911) includes input multiplexers and inverters, as in the embodiment of FIG. 8, but longer gate lengths are used in the data generating circuit than in other areas of the circuit. As in the embodiment of FIG. 8, input multiplexers IMUXa-IMUXd are inserted between the interconnect structure of the FPGA and the data input terminals IN0–IN3. The input multiplexers can be, for example, similar to the input multiplexers of the Xilinx Virtex-II Pro FPGA, but are manufactured using the thicker oxide used for the transistors in area 911. The input multiplexers use an operating voltage of VGG, in order to drive the pass transistors at the VGG high level. As in the embodiment of FIG. 5, three different gate lengths are used. The longest gate lengths are used in the input multiplexers and inverters of area 911, the shortest gate lengths are used in the memory cells and buffers of areas 921–923, and a gate length between the two is used for the pass transistors of areas 912–913.

Figure 10:
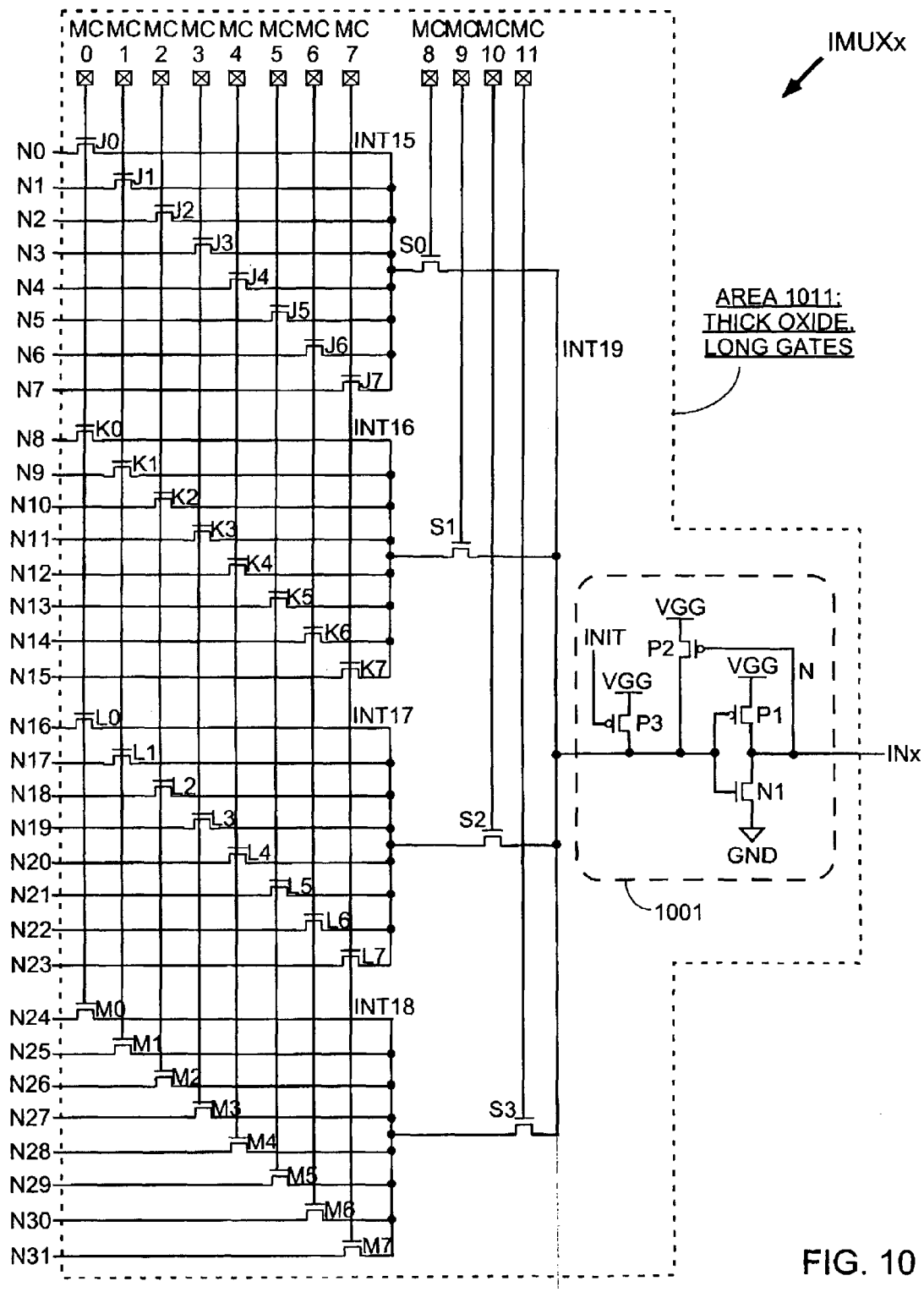
FIG. 10 shows an input multiplexer that can be used in the embodiments of FIGS. 8 and 9 according to an embodiment of the invention.

FIG. 10 illustrates one embodiment IMUXx of input multiplexers IMUXa-IMUXd that can be used in the embodiments of FIGS. 8 and 9. Input multiplexer IMUXX is a 32-to-1 multiplexer, with input signals N0–N31 being provided by the interconnect structure of the FPGA. One of signals N0–N31 is selected using pass transistors J0–J7, K0–K7, L0–L7, M0–M7, and S0–S3 under the control of memory cells MC0–MC11. The selected input signal is passed through buffer 1001 to the data input terminal INx of the LUT. In other embodiments, the input multiplexers can have a different number of input signals, a different number of pass transistors on each path, an additional one or more buffers on each path, and so forth. In the pictured embodiment, the memory cells, pass transistors, and buffer are all manufactured using the thicker oxide used in areas 811, 911 and the longer gate lengths used in area 911.

Note that in the pictured embodiment the whole of input multiplexer IMUXx (area 1011) is manufactured using the thicker oxide and longer gate lengths. Buffer 1001 is manufactured using the thicker oxide and longer gate lengths, unlike the buffers in areas 822–823 and 922–923, because buffer 1001 provides signals INx at a high voltage level of VGG. Therefore, pass transistors J0–J7, K0–K7, L0–L7, M0–M7, and S0–S3 are also manufactured using the thicker oxide and longer gate lengths, unlike the pass transistors of areas 812–813 and 912–913, in order to successfully drive buffer 1001. Hence, memory cells MC0–MC11 also use the thicker oxide and longer gate lengths, unlike the memory cells in areas 821 and 921.

Figure 1B:
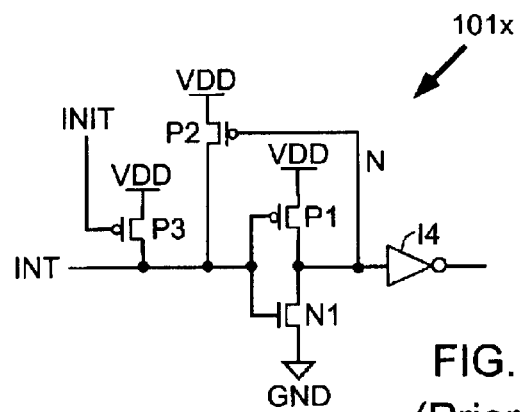
FIG. 1B shows a known buffer commonly used in FPGA LUTs.
Figure 2:
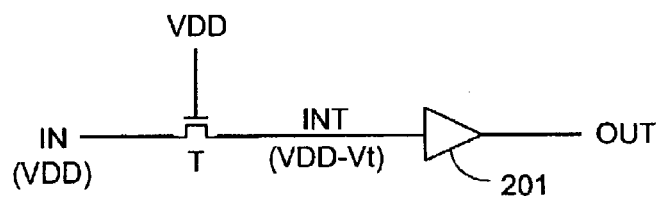
FIG. 2 shows a pass gate followed by a buffer, where the same operating voltage is used for all transistors.

Buffer 1001 can be implemented, for example, using a circuit similar to buffer 101x, shown in FIG. 1B. However, buffer 1001 is powered by VGG rather than by VDD, as shown in FIG. 10. Therefore, the output signal INx from buffer 1001 has a high voltage level of VGG. Pullup P2 pulls node INT19 to VGG, fully shutting off pullup P1 and thus preventing undesirable crowbar current. As shown in FIG. 10, all transistors in buffer 1001 have the thick oxide, and can tolerate contact with the VGG voltage level. Use of this structure makes it unnecessary to include a separate level shifter on the path between the input multiplexer IMUXX and the gates of the pass transistors in the LUT.

In some embodiments, the structures of the invention are included in an IC manufactured using three different oxide thicknesses. The thinnest oxide is used for the memory cells and buffers in the described structures (and for other circuits in the device as well). The medium-thickness oxide is used for the pass transistors in the described structures. The thickest oxide is used in the input/output (I/O) structures of the IC.

It is well known to use a thicker oxide in the I/O structures of integrated circuits. It is not uncommon for input signals provided to an IC to have a high voltage value that is greater than the core operating voltage of the device. For example, ICs with a core operating voltage of 1.5 V and a VGG value of 1.6 volts might be required to interface with other ICs that provide and receive signals at 2.5 volts. To support these higher voltages, I/O structures are commonly manufactured with a much thicker oxide than the internal structures of the IC.

However, it is not generally desirable to use this much thicker oxide in internal structures such as the circuits provided herein. The much thicker oxide requires very large transistors and generally results in much worse performance than the medium-thickness oxide described herein.

Those having skill in the relevant arts of the invention will now perceive various modifications and additions that can be made as a result of the disclosure herein. For example, the above text describes the structures of the invention in the context of ICs such as programmable logic devices (PLDS) and field programmable gate arrays (FPGAs). However, the structures of the invention can also be implemented in other integrated circuits, including non-programmable circuits. Additionally, in PLDs and FPGAs the structures are described in the context of lookup tables (LUTs). However, the structures of the invention can also be included in other circuits and for other purposes.

Further, buffers, memory cells, pass transistors, P-channel transistors, N-channel transistors, pullups, pulldowns, data generating circuits, level shifters, inverters, input multiplexers, interconnect structures, FPGAS, PLDS, ICs, and other components other than those described herein can be used to implement the invention. Active-high signals can be replaced with active-low signals by making straightforward alterations to the circuitry, such as are well known in the art of circuit design. Logical circuits can be replaced by their logical equivalents by appropriately inverting input and output signals, as is also well known.

Moreover, some components are shown directly connected to one another while others are shown connected via intermediate components. In each instance the method of interconnection establishes some desired electrical communication between two or more circuit nodes. Such communication can often be accomplished using a number of circuit configurations, as will be understood by those of skill in the art.

Accordingly, all such modifications and additions are deemed to be within the scope of the invention, which is to be limited only by the appended claims and their equivalents.

What is claimed is:

1. A circuit, comprising:
   a plurality of memory cells;
   an internal node;
   an output terminal;
   a plurality of data input terminals;
   a plurality of pass transistors coupled between the memory cells and the internal node, each pass transistor having a gate terminal coupled to receive from one of the data input terminals a selected one of a ground signal and a power high signal at a first voltage level; and
   a buffer coupled between the internal node and the output terminal,
   wherein:
      each pass transistor has a first oxide thickness;
      each memory cell is coupled to an operating voltage at a second voltage level less than the first voltage level;
      each memory cell comprises memory cell transistors having a second oxide thickness, where the second oxide thickness is less than the first oxide thickness;

the buffer is coupled to an operating voltage at the second voltage level; and the buffer comprises buffer transistors having the second oxide thickness.

2. The circuit of claim 1, wherein:

each of the pass transistors has a first gate length;

the memory cell transistors have a second gate length;

the buffer transistors have the second gate length; and the first gate length is longer than the second gate length.

3. The circuit of claim 1, further comprising a data generating circuit coupled to the data input terminals and to an operating voltage at the first voltage level, the data generating circuit comprising data generating transistors having the first oxide thickness.

4. The circuit of claim 3, wherein:

each of the pass transistors has a first gate length;

the memory cell transistors have a second gate length;

the buffer transistors have the second gate length;

the data generating transistors have a third gate length;

the first gate length is longer than the second gate length; and the first gate length is shorter than the third gate length.

5. The circuit of claim 3, wherein:

each of the pass transistors has a first gate length;

the data generating transistors have a third gate length; and the first gate length is shorter than the third gate length.

6. The circuit of claim 3, wherein:

each of the pass transistors has a first gate length;

the memory cell transistors have a second gate length;

the buffer transistors have the second gate length;

the data generating transistors have the first gate length; and the first gate length is longer than the second gate length.

7. The circuit of claim 3, wherein the pass transistors, the memory cell transistors, the buffer transistors, and the data generating transistors all have the same gate length.

8. The circuit of claim 1, wherein the circuit forms a portion of an integrated circuit (IC), and the second voltage level is an operating voltage used as a supply voltage by a majority of transistors in the IC.

9. The circuit of claim 1, wherein the circuit forms a portion of a programmable logic device (PLD).

10. The circuit of claim 9, wherein the PLD is a field programmable gate array (FPGA), and the memory cells are configuration memory cells of the FPGA.

11. The circuit of claim 10, wherein the circuit is a lookup table (LUT) structure in the FPGA.

12. A field programmable gate array (FPGA), comprising:

an interconnect structure;

a plurality of input multiplexers coupled to the interconnect structure and to an operating voltage at a first voltage level; and a plurality of lookup table (LUT) structures coupled to the input multiplexers, wherein each of the LUT structures comprises:

a plurality of memory cells;

an internal node;

an output terminal coupled to the interconnect structure;

a plurality of data input terminals each coupled to an output terminal of one of the input multiplexers;

a plurality of pass transistors coupled between the memory cells and the internal node, each pass transistor having a gate terminal coupled to receive from one of the data input terminals a selected one of a ground signal and a power high signal at the first voltage level; and a buffer coupled between the internal node and the output terminal, and wherein:

each pass transistor has a first oxide thickness;

each memory cell is coupled to an operating voltage at a second voltage level less than the first voltage level;

each memory cell comprises memory cell transistors having a second oxide thickness, where the second oxide thickness is less than the first oxide thickness;

the buffer is coupled to an operating voltage at the second voltage level;

the buffer comprises buffer transistors having the second oxide thickness; and each input multiplexer comprises input multiplexer transistors having the first oxide thickness.

13. The FPGA of claim 12, wherein:

each of the pass transistors has a first gate length;

the memory cell transistors have a second gate length;

the buffer transistors have the second gate length; and the first gate length is longer than the second gate length.

14. The FPGA of claim 13, wherein the input multiplexer transistors have the first gate length.

15. The FPGA of claim 12, wherein:

each of the pass transistors has a first gate length;

the input multiplexer transistors have a third gate length; and the first gate length is shorter than the third gate length.

16. The FPGA of claim 12, wherein the pass transistors, the memory cell transistors, the buffer transistors, and the input multiplexer transistors all have the same gate length.

17. The FPGA of claim 12, wherein the second voltage level is an operating voltage used as a supply voltage by a majority of transistors in the FPGA.

18. The FPGA of claim 12, further comprising a plurality of input/output blocks coupled to the interconnect structure, and wherein the input/output blocks each comprise input/output transistors having a third oxide thickness greater than the first oxide thickness.

19. The FPGA of claim 12, wherein each of the LUT structures further comprises additional pass transistors and buffers, and the buffer is coupled to the output terminal through the additional pass transistors and buffers.

20. An integrated circuit (IC), comprising:

a plurality of input/output blocks;

a plurality of interconnect lines coupled to the input/output blocks; and a circuit coupled to the interconnect lines, the circuit comprising:

a plurality of memory cells;

an internal node;

an output terminal coupled to one of the interconnect lines;

a data generating circuit coupled to the interconnect lines and to an operating voltage at a first voltage level;

a plurality of pass transistors coupled between the memory cells and the internal node, each pass transistor having a gate terminal coupled to receive from the data generating circuit a selected one of a ground signal and a power high signal at a first voltage level; and a buffer coupled between the internal node and the output terminal, wherein:

the data generating circuit comprises data generating transistors having a first oxide thickness;

each pass transistor has the first oxide thickness;

each memory cell is coupled to an operating voltage at a second voltage level less than the first voltage level;

each memory cell comprises memory cell transistors having a second oxide thickness, where the second oxide thickness is less than the first oxide thickness;

the buffer is coupled to an operating voltage at the second voltage level; and the buffer comprises buffer transistors having the second oxide thickness.

21. The IC of claim 20, wherein the input/output blocks each comprise input/output transistors having a third oxide thickness greater than the first oxide thickness.

22. The IC of claim 20, wherein:

each of the pass transistors has a first gate length;

the memory cell transistors have a second gate length;

the buffer transistors have the second gate length;

the data generating transistors have a third gate length;

the first gate length is longer than the second gate length; and the first gate length is shorter than the third gate length.

23. The IC of claim 20, wherein:

each of the pass transistors has a first gate length;

the memory cell transistors have a second gate length;

the buffer transistors have the second gate length;

the data generating transistors have the first gate length; and the first gate length is longer than the second gate length.

24. The IC of claim 20, wherein:

each of the pass transistors has a first gate length;

the data generating transistors have a third gate length; and the first gate length is shorter than the third gate length.

25. The IC of claim 20, wherein the pass transistors, the memory cell transistors, the buffer transistors, and the data generating transistors all have the same gate length.

26. The IC of claim 20, wherein the second voltage level is an operating voltage used as a supply voltage by a majority of transistors in the IC.

27. The IC of claim 20, wherein the circuit further comprises additional pass transistors and buffers, and the buffer is coupled to the output terminal through the additional pass transistors and buffers.

28. The IC of claim 20, wherein the IC is a programmable logic device (PLD).

29. The IC of claim 28, wherein the PLD is a field programmable gate array (FPGA), and the memory cells are configuration memory cells of the FPGA.

30. The IC of claim 28, wherein the circuit is a lookup table (LUT) structure in the FPGA.

31. A circuit, comprising:

a plurality of first input terminals;

an internal node;

an output terminal;

a plurality of data input terminals supplying a dynamically changing signal;

a plurality of pass transistors coupled between the first input terminals and the internal node, each pass transistor having a gate terminal coupled to receive from one of the data input terminals a selected one of a ground signal and a power high signal at a first voltage level; and a buffer coupled between the internal node and the output terminal, wherein:

each pass transistor has a first oxide thickness;

each first input terminal is coupled to provide a selected one of the ground signal and a power high signal at a second voltage level less than the first voltage level;

the buffer is coupled to an operating voltage at the second voltage level; and the buffer comprises buffer transistors having a second oxide thickness, where the second oxide thickness is less than the first oxide thickness.

32. The circuit of claim 31, wherein:

each of the pass transistors has a first gate length;

the buffer transistors have a second gate length; and the first gate length is longer than the second gate length.

33. The circuit of claim 31, further comprising a data generating circuit coupled to the data input terminals and to an operating voltage at the first voltage level, the data generating circuit comprising data generating transistors having the first oxide thickness, the data generating circuit being driven by a signal at the second voltage level.

34. The circuit of claim 33, wherein the data generating circuit comprises a plurality of input multiplexers.

35. The circuit of claim 34, wherein each of the input multiplexers comprises:

an inverter having an input terminal and further having an output terminal coupled to a corresponding one of the data input terminals, the inverter being coupled between the operating voltage at the first voltage level and the ground; and a pullup coupled between the input terminal of the inverter and the operating voltage at the first voltage level, the pullup having a gate terminal coupled to the output terminal of the inverter.

36. The circuit of claim 33, wherein:

each of the pass transistors has a first gate length;

the buffer transistors have a second gate length;

the data generating transistors have a third gate length;

the first gate length is longer than the second gate length; and the first gate length is shorter than the third gate length.

37. The circuit of claim 33, wherein:

each of the pass transistors has a first gate length;

the data generating transistors have a third gate length; and the first gate length is shorter than the third gate length.

38. The circuit of claim 33, wherein:

each of the pass transistors has a first gate length;

the buffer transistors have a second gate length;

the data generating transistors have the first gate length; and the first gate length is longer than the second gate length.

39. The circuit of claim 33, wherein the pass transistors, the buffer transistors, and the data generating transistors all have the same gate length.

40. The circuit of claim 31, wherein the circuit forms a portion of an integrated circuit (IC), and the second voltage level is an operating voltage used as a supply voltage by a majority of transistors in the IC.

41. The circuit of claim 31, wherein the circuit forms a portion of a programmable logic device (PLD).

42. The circuit of claim 41, wherein the PLD is a field programmable gate array (FPGA).

43. The circuit of claim 42, wherein the circuit is a lookup table (LUT) structure in the FPGA.

* * * * *